(12) United States Patent
Yin et al.

(10) Patent No.: US 12,405,408 B2
(45) Date of Patent: Sep. 2, 2025

(54) OPTICAL FILM AND DISPLAY DEVICE

(71) Applicant: Shenzhen China Star Optoelectronics Semiconductor Display Technology Co., Ltd., Shenzhen (CN)

(72) Inventors: Zhiyuan Yin, Shenzhen (CN); Lixuan Chen, Shenzhen (CN); Hu Dou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/618,510

(22) PCT Filed: Nov. 11, 2021

(86) PCT No.: PCT/CN2021/130144
§ 371 (c)(1),
(2) Date: May 4, 2023

(87) PCT Pub. No.: WO2023/070751
PCT Pub. Date: May 4, 2023

(65) Prior Publication Data
US 2024/0036239 A1    Feb. 1, 2024

(30) Foreign Application Priority Data
Nov. 1, 2021 (CN) .......................... 202111283626.4

(51) Int. Cl.
*G02B 5/02* (2006.01)
*G02F 1/1335* (2006.01)
*H10K 59/80* (2023.01)

(52) U.S. Cl.
CPC ..... *G02B 5/0231* (2013.01); *G02F 1/133504* (2013.01); *H10K 59/878* (2023.02)

(58) Field of Classification Search
CPC ............. G02B 5/0231; G02F 1/133504; G02F 1/1335; G02F 1/133553; H10K 59/878; H10K 59/879; H10K 59/10
See application file for complete search history.

(56) References Cited

U.S. PATENT DOCUMENTS 4,995,701 A    2/1991 Brown
2010/0013799 A1    1/2010 Kim et al.
(Continued)

FOREIGN PATENT DOCUMENTS

CN    102866536 A    1/2013
CN    104696876 A    6/2015
(Continued)

*Primary Examiner* — Mariam Qureshi
(74) *Attorney, Agent, or Firm* — Nathan & Associates Patent Agents Ltd.; Menachem Nathan (57) ABSTRACT

An optical film and a display device are provided. The optical film includes: multiple optical structures, wherein one side of each optical structure away from a display surface is provided with multiple arced surfaces for reflecting at least a portion of environment light, and each optical structure has a first refractive index; and a filling part being filled between the optical structures and having a second refractive index greater than the first refractive index. Adjusting curvatures of the arced surfaces can implement the adjustment of the angle of reflection to the environment light.

14 Claims, 3 Drawing Sheets

(56) References Cited

U.S. PATENT DOCUMENTS

| | | | |
|---|---|---|---|
| 2010/0302479 A1* | 12/2010 | Aronson | B29D 11/00326 |
| | | | 428/141 |
| 2014/0353626 A1 | 12/2014 | Shim et al. | |
| 2019/0146137 A1 | 5/2019 | Wang et al. | |
| 2020/0033665 A1 | 1/2020 | Jeong et al. | |
| 2020/0133062 A1* | 4/2020 | Lee | G02F 1/133504 |
| 2021/0018792 A1* | 1/2021 | Ok | G02F 1/133526 |

FOREIGN PATENT DOCUMENTS

| | | |
|---|---|---|
| CN | 205485177 U | 8/2016 |
| CN | 106918855 A | 7/2017 |
| CN | 107533180 A | 1/2018 |
| CN | 109143445 A | 1/2019 |
| CN | 109709738 A | 5/2019 |
| CN | 211123564 U | 7/2020 |
| CN | 111796348 A | 10/2020 |
| CN | 113514983 A | 10/2021 |
| JP | 2011154585 A | 8/2011 |
| JP | 2012073487 A | 4/2012 |
| JP | 2015191048 A | 11/2015 |

\* cited by examiner

OPTICAL FILM AND DISPLAY DEVICE

FIELD OF INVENTION

This disclosure relates to a technical field of a display device, and more particularly to an optical film and a display device.

BACKGROUND OF INVENTION

The reflectivity is an important optical specification of a large-size display device. The reflectivity represents the amount of light that can be reflected by the display device when a user watches the extinguished display device from a front side of the display device. Considering the user's habit of using the display device, the user usually does not wish to see the reflected light from the extinguished display device. That is, the display device is required to have the lower reflectivity to protect the user's privacy.

However, the conventional optical film usually has the poor effect of decreasing the reflectivity.

SUMMARY OF INVENTION

Technical Problems

In the prior art, the optical film usually has the poor effect of decreasing the reflectivity.

Technical Solutions

An embodiment of this disclosure provides an optical film and a display device to solve the problem that the conventional optical film usually has the poor effect of decreasing the reflectivity.

In a first aspect, the embodiment of this disclosure provides an optical film applied to a display panel. The optical film is disposed on one side of a display surface of the display panel. The optical film includes:

multiple optical structures, wherein one side of each of the optical structures away from the display surface is provided with multiple arced surfaces for reflecting at least a portion of environment light, and each of the optical structures has a first refractive index; and a filling part, which is disposed on one side of the optical structures away from the display surface, covers the optical structures, is filled between the optical structures, and has a second refractive index greater than the first refractive index.

An embodiment of this disclosure further provides a display device including a display panel and the optical film mentioned hereinabove.

Useful Effects

In the optical film and the display device according to the embodiments of this disclosure, it is possible to adjust values of refractive indexes of the filling part and the optical structure to adjust a critical angle of refraction between the optical structure and the filling part, thereby implementing the total internal reflection (TIR) of the optical structure. In addition, arced surfaces capable of reflecting at least a portion of environment light are provided in the optical structures, so that the curvatures of the arced surfaces can be adjusted to implement the adjustment of the angle of reflection to the environment light, so that the requirement of the low reflectivity is implemented through the optical film in the display device.

DESCRIPTION OF DRAWINGS

In order to illustrate the technical solutions in the embodiments of this disclosure more clearly, the drawings required for the descriptions of the embodiments will be briefly introduced in the following. Obviously, the drawings in the following description are just some embodiments of this disclosure. For those skilled in the art, other drawings can be obtained from these drawings without creative works. In order to make this disclosure and the beneficial effects thereof be understood more completely, explanations will be made in the following in conjunction with the drawings. In the following description, the same reference numerals refer to the same parts.

DETAILED DESCRIPTION OF EMBODIMENTS

The technical solutions in the embodiments of this disclosure will be clearly and completely described in the following with reference to the drawings of the embodiments of this disclosure. Obviously, the described embodiments are only a part of the embodiments of this disclosure, rather than all the embodiments. Based on the embodiments of this disclosure, all other embodiments obtained by those skilled in the art without creative works are deemed as falling within the scope of this disclosure.

The reflectivity is an important optical specification in large-size display devices, such as a liquid crystal display (LCD), an organic light-emitting diode (OLED) display or an organic light-emitting semiconductor display, and the like. The reflectivity represents the amount of light that can be reflected by the display device when the user watches the extinguished display device from a front side of the display device. Considering the user's habit of using the display device, the user usually does not wish to see the reflected light from the extinguished display device. That is, the display device is required to have the lower reflectivity. The low reflectivity usually means that the less amount of light that can be reflected by the display device in the extinguished state of the display device, so that the user cannot implement the operation of "looking in the mirror" through the screen of the display device, the user's privacy can be protected, and the display device has the better performance.

However, the conventional optical film usually has the poor effect of decreasing the reflectivity.

In order to solve the above-mentioned problems, the embodiments of this disclosure provide an optical film and a display device, and the following explanations will be made in conjunction with the drawings.

Figure 1:
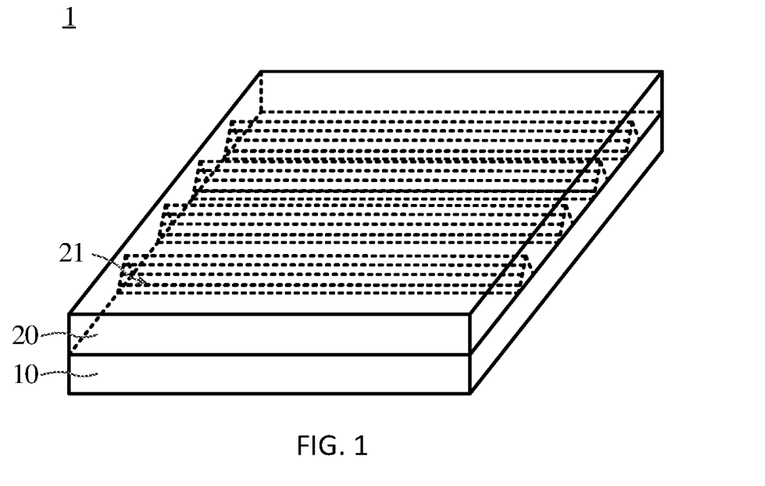
FIG. 1 is a schematic structure view showing a display device provided by an embodiment of this disclosure.

Exemplarily, please refer to FIG. 1. FIG. 1 is a schematic structure view showing a display device provided by an embodiment of this disclosure. The embodiment of this disclosure provides a display device 1, which may be a device, such as a mobile phone, a desktop computer, a notebook, a tablet computer, a wrist watch apparatus, a television, a media playback apparatus, a computer monitor and the like, having a display function. The display device 1 may include a display panel 10 and an optical film 20. The display panel 10 can output light. The display panel 10 has a display surface and a non-display surface. The display surface may be understood as one side of the display panel 10 displaying output light, and the non-display surface is the other side disposed opposite the display surface and does not output light. The optical film 20 of the embodiment of this disclosure can improve the problem of the display device 1 having the low reflectivity in the extinguished state to cause the poor effect, and the optical film 20 can adjust an exit angle of output light of the display panel 10.

In order to explain the principle of action and structural compositions of the optical film 20 of the embodiment of this disclosure more clearly, explanations to the structural compositions and the principle of action of the optical film 20 will be made in the following in conjunction with the drawings.

Figure 2:
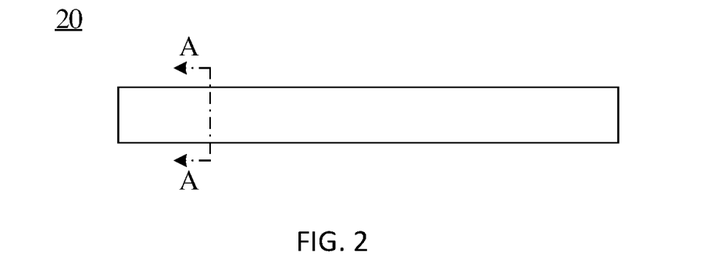
FIG. 2 is a schematic structure view showing an optical film in the display device shown in FIG. 1.
Figure 3:
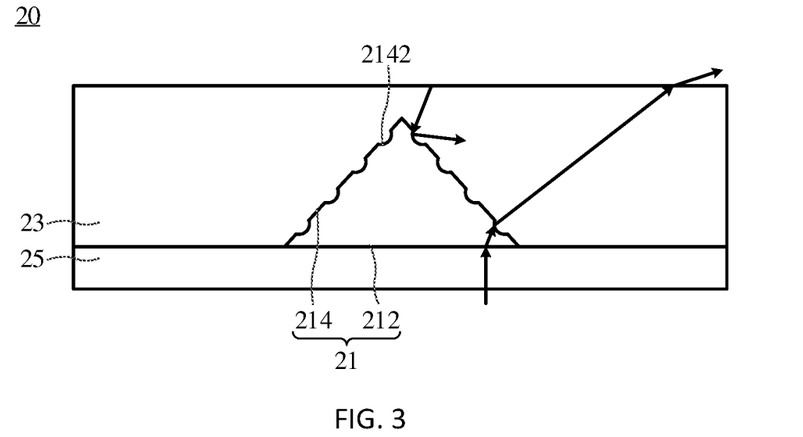
FIG. 3 is a first schematic cross-sectional structure view showing the optical film of FIG. 2 taken in the A-A direction.

Exemplarily, please refer to FIGS. 2 and 3 in conjunction with FIG. 1. FIG. 2 is a schematic structure view showing an optical film in the display device shown in FIG. 1. FIG. 3 is a first schematic cross-sectional structure view showing the optical film of FIG. 2 taken in the A-A direction. The embodiment of this disclosure provides the optical film 20 applied to the display panel 10. The optical film 20 is disposed on one side of the display surface of the display panel 10. The optical film 20 may include multiple optical structures 21. One side of each optical structure 21 away from the display surface is provided with multiple arced surfaces 2142 for reflecting at least a portion of environment light. Each optical structure 21 has a first refractive index. Each optical film 20 further includes a filling part 23, which is disposed on one side of the optical structures 21 away from the display surface, covers the optical structures 21, is filled between the optical structures 21, and has a second refractive index greater than the first refractive index.

In the optical film 20 of the embodiment of this disclosure, adjusting values of the refractive indexes of the filling part 23 and the optical structure 21 can adjust a critical angle of refraction between the optical structure 21 and the filling part 23, and thus implement the TIR of the optical structure 21. Also, the optical structures 21 are provided with the arced surfaces 2142 capable of reflecting the at least a portion of environment light, so that curvatures of the arced surfaces 2142 can be adjusted to implement the adjustment of the angle of reflection to the environment light, and that the requirement of the low reflectivity can be implemented through the optical film 20 in the display device 1.

It is to be described that the optical film 20 needs to satisfy the requirement of TIR in order to implement the requirement of the low reflectivity of the optical film 20. TIR is an optical phenomenon. When the light enters the medium having the lower refractive index from the medium having the higher refractive index, the refracted light will disappear if an incident angle is greater than a certain critical angle (the light travels away from the normal), and all incident light rays are reflected without entering the medium having the low refractive index. Therefore, the second refractive index of the filling part 23 is configured to be greater than the first refractive index of the optical structure 21, thereby implementing the TIR of the environment light to the optical structure 21 through the filling part 23.

TIR is a first step for the implementation of the low reflectivity of the optical film 20. The low reflectivity of the optical film 20 means that a less portion of light of TIR is reflected to one side of the display surface, and may also be understood as that the external environment light reaches the surface of the optical structure 21 through the filling part 23, and then reflected to the non-display surface. Thus, the user cannot see the reflection of the environment light when watching the display surface. Based on this, the requirement of the low reflectivity of the optical film 20 can be implemented. In order to implement the above-mentioned optical reflection, the embodiment of this disclosure adjusts the reflected light by providing the arced surfaces 2142, so that reflected light can be reflected to the non-display surface by adjusting the curvatures of the arced surfaces 2142.

The optical film 20 of the embodiment of this disclosure can further adjust the exit angle of the output light of the display panel 10 to implement the requirement of the wide viewing angle of the optical film 20.

It is to be described that the brightness performance of the large-size display device gets worse and worse as the viewing angle becomes larger. To solve this problem, the prior art usually uses the optical film to improve the problem of the large viewing angle. The objective of improving the performance of the display device at the large viewing angle can be achieved by additionally providing films, having different micro-structures, on the display device. Meanwhile, in order to further satisfy the lower external light reflectivity of the surface of the display device, a polarizer or an anti-reflection film needs to be attached to the display panel to decrease the surface reflectivity. Therefore, films having two or more than two functions need to be combined in order to satisfy the specifications of the wide viewing angle and the low reflectivity of the display device.

However, after multiple films are combined, the optical property of the composite film changes as compared with that of one single film, and whether the optical performance thereof satisfies the requirement needs to be evaluated again. In addition, the processes of the composite film also become more complicated. If the composite film is used in the mass production, the manufacturing cost of the film is increased, and the corresponding composite process needs to be added, thereby increasing the production time and the labor cost. Therefore, a new film needs to be developed to improve the above-mentioned condition.

Exemplarily, each optical structure 21 may includes a bottom wall 212 and multiple sidewalls 214. The bottom wall 212 is disposed on one side of the sidewalls 214 facing the display panel 10. The sidewalls 214 may tilt to the bottom wall 212. The arced surfaces 2142 are disposed on at least one sidewall 214. At least a portion of light outputted from the display panel 10 is incident to the optical structure 21 from the bottom wall 212 at a first incident angle, and is refracted out of the optical structure 21 through the arced surfaces 2142 at a first refraction angle. The first refraction angle is greater than the first incident angle. At least a portion of environment light is reflected to the non-display surface of the display panel 10 through the arced surfaces 2142.

In the optical film 20 of the embodiment of this disclosure, the sidewalls 214 of the optical structure 21 tilt to the bottom wall 212, so that the first refraction angle of the output light of the display panel 10 can be as large as possible by adjusting the tilt angles, thereby satisfying the requirement of the wide viewing angle of the optical film 20.

The optical film 20 of the embodiment of this disclosure can satisfy the requirement of the wide viewing angle as well as the requirement of the low reflectivity. It is only necessary to configure the optical structure 21 to have the prismatic shape and to dispose the arced surfaces 2142 on the optical structure 21 to implement both of the above-mentioned requirements. Compared with the conventional composite film, the process becomes simple.

It is to be described that the first refraction angle can be adjusted by adjusting the tilt angle of the sidewall 214 relatively to the bottom wall 212 and the height of the optical structure 21 so that the optical film 20 has the larger refraction angle, that the user can watch the display device 1 from various angles to obtain the same display effect, and that the requirement of the wide viewing angle of the display device 1 is satisfied. The optical structure 21 may further make the environment light be reflected to the non-display surface of the display panel 10 through the arced surfaces 2142, but not make the environment light be reflected to the incident direction of the environment light, so that the reflectivity of the display device 1 can be decreased, and the requirement of the low reflectivity of the display device 1 to the environment light is satisfied. The embodiment of this disclosure can concurrently satisfy the requirements of the wide viewing angle and the low reflectivity of the display device 1 using one optical film 20. Compared with the conventional composite film, the process becomes simple.

Figure 4:
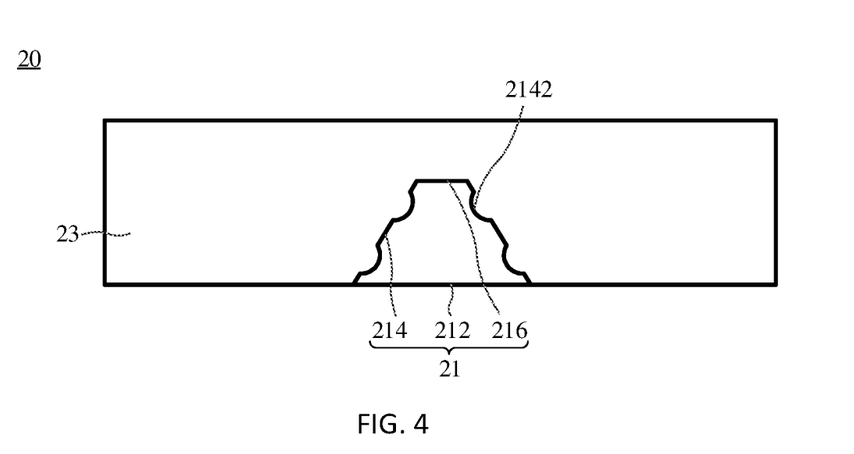
FIG. 4 is a second schematic cross-sectional structure view showing the optical film of FIG. 2 taken in the A-A direction.
Figure 5:
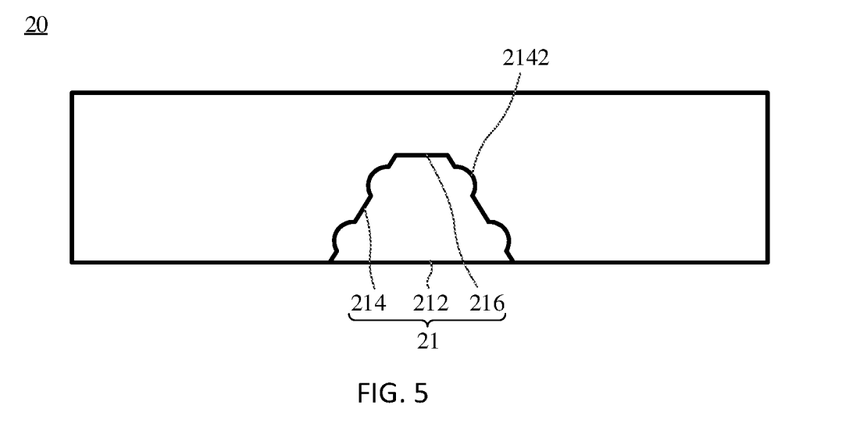
FIG. 5 is a third schematic cross-sectional structure view showing the optical film of FIG. 2 taken in the A-A direction.

Please refer to FIG. 4 in conjunction with FIGS. 1 to 3. FIG. 4 is a second schematic cross-sectional structure view showing the optical film of FIG. 2 taken in the A-A direction. Each arced surface 2142 may be depressed toward the bottom wall 212, so that the optical structure 21 is provided with the structures of multiple depressed arced surfaces 2142. In some embodiments, please refer to FIG. 5 in conjunction with FIGS. 1 and 2. FIG. 5 is a third schematic cross-sectional structure view showing the optical film of FIG. 2 taken in the A-A direction. Each arced surface 2142 may further project away from the bottom wall 212, so that the optical structure 21 is provided with the structures of multiple convex arced surfaces 2142. It is to be described that the provision of the arced surfaces 2142 can change the direction of normal of the light, thereby implementing the requirement of the low reflectivity of the optical film 20. Therefore, either the depressions or projections of the arced surfaces 2142 are provided with respect to the bottom wall 212, the optical structure 21 of the embodiment of this disclosure can change the direction of normal of the environment light, thereby adjusting the angle of reflection of the environment light, and implementing the requirement of the low reflectivity of the optical film 20.

Exemplarily, the arced surfaces 2142 may have the same arc curvatures. Such the arced surfaces 2142 can make the optical structures 21 be conveniently manufactured. Exemplarily, the radius of curvature may be an arbitrary value ranging from 2 microns to 4 microns. For example, the radius of curvature of each of the arced surfaces 2142 may be equal to 2.5, 2.8 or 3 microns. By selecting the arc curvatures of the arced surfaces 2142, it is possible to adjust the angle of reflection of the environment light to implement the requirement of the low reflectivity of the optical film 20.

Exemplarily, two sidewalls 214 extending in a lengthwise direction of the optical structure 21 are respectively provided with multiple arced surfaces 2142. Inner angles respectively formed between the two sidewalls 214 and the bottom wall 212 are equal to each other. It is to be described that the optical structure 21 can extend from an end portion of the display panel 10 in the lengthwise or widthwise direction of the display panel 10. This extending direction is the lengthwise direction of the optical structure 21. The two sidewalls 214 are respectively provided with the arced surfaces 2142 in the lengthwise direction of the optical structure 21. It is understandable that the optical structure 21 may include a bottom wall 212 and four sidewalls 214, wherein two of the four sidewalls 214 extending in the lengthwise direction of the optical structure 21 are disposed opposite each other, and multiple arced surfaces 2142 are provided on each sidewall 214. The two sidewalls 214 provided with the arced surfaces 2142 are disposed opposite each other. Included angles between the bottom wall 212 and the sidewalls 214 are equal to each other. That is, inner angles formed between the bottom wall 212 and the sidewalls 214 are equal to each other. The output light of the display panel 10 can be adjusted by adjusting the inner angles between the bottom wall 212 and the sidewalls 214 and the height of the optical structure 21, so that the output light of the display panel 10 travelling through the optical film 20 has the first refraction angle, thereby implementing the requirement of the wide viewing angle of the optical film 20. The two sidewalls 214 provided with the arced surfaces 2142 are disposed symmetrically. The other two sidewalls 214 in the four sidewalls 214 are disposed opposite each other in the lengthwise direction of the optical film 20, and the two sidewalls 214 are not provided with the arced surface 2142. The two sidewalls 214 without the arced surface 2142 may be flush with the end surface of the display panel 10. In addition, the areas of the sidewalls 214 without the arced surface 2142 are smaller than the areas of the sidewalls 214 provided with the arced surfaces 2142.

The optical structure 21 may have a prismatic shape. For example, as shown in FIG. 3, the optical structure 21 may have a triangular prism shape. Ends of the two sidewalls 214 provided with the arced surfaces 2142 away from the bottom wall 212 are connected together. It is understandable that the two sidewalls 214 without the arced surface 2142 are triangular in the lengthwise direction of the optical structure 21, and that two edges thereof have multiple arcs. For example, as shown in FIGS. 4 and 5, the optical structure 21 may further have a quadrangular prism shape. The optical structure 21 may further include a top wall 216 disposed opposite the bottom wall 212, wherein two ends of the top wall 216 are respectively connected to the two sidewalls 214 provided with the arced surfaces 2142. It is understandable that the two sidewalls 214 without the arced surface 2142 are trapezoidal in the lengthwise direction of the optical structure 21, and two lateral sides of the trapezoid have multiple arcs.

Exemplarily, referring again to FIGS. 1 to 3, the filling part 23 is disposed on one side of the optical structures 21 away from the display surface, covers the optical structures 21, and is filled between the optical structures 21. It is to be described that the optical structures 21 may be disposed in parallel with one side of the display surface of the display panel 10. That is, the optical structures 21 are parallelly and sequentially arranged on one side of the display surface of the display panel 10. A predetermined distance may be present between adjacent two optical structures 21. The adjacent two optical structures 21 may also abut upon each other. The embodiment of this disclosure is described according to the predetermined distance present between the adjacent two optical structures 21. Multiple sequentially arranged optical structures 21 may be arranged in the lengthwise direction of the display panel 10, and may also be arranged in the widthwise direction of the display panel 10, and no restriction is made thereto. The filling part 23 covers the optical structures 21, and is filled between the optical structures 21. It is understandable that the filling part 23 covers the optical structures 21 and is filled between multiple optical structures 21 when adjacent two optical structures 21 abut upon each other. At this time, the bottommost end of the filling part 23 in the direction of the display surface and the bottom wall 212 of the optical structure 21 are not disposed on the same plane. When the predetermined distance is present between adjacent two optical structures 21, the filling part 23 covers the optical structures 21, and the filling part 23 and the bottom wall 212 of the optical structure 21 are disposed on the same plane. The filling part 23 and the optical structures 21 constitute a smooth film structure.

Exemplarily, the optical film 20 may further include a base layer 25 disposed on one side of the optical structures 21 facing the display panel 10. It is understandable that the optical film 20 may be a layered structure including the base layer 25, the optical structures 21 and the filling part 23. The base layer 25 is disposed at bottom, the optical structures 21 are disposed in parallel with the base layer 25, and the filling part 23 covers the optical structures 21 and is filled between the optical structures 21.

The optical film 20 may be constituted by three materials. That is, the base layer 25, the filling part 23 and the optical structure 21 are respectively formed using different materials. Exemplarily, the base layer 25 may have a third refractive index, which may be greater than the first refractive index and smaller than the second refractive index. That is, the second refractive index of the filling part 23 is greater than the third refractive index of the base layer 25, and the third refractive index of the base layer 25 is greater than the first refractive index of the optical structure 21. It is to be described that the light needs to travel from the optically dense medium to the optically less dense medium in order to implement the TIR of the environment light. Therefore, the second refractive index of the filling part 23 is greater than the first refractive index of the optical structure 21. The output light of the display panel 10 needs to travel to the optical structure 21 through the base layer 25 and to be refracted out, and then refracted to the outside from the optical structure 21 through the filling part 23, and the first refraction angle of light refracted to the outside needs to be as large as possible. When the light enters the medium, in which the speed of light is low (the refractive index is low) from the medium, in which the speed of light is high (the refractive index is high), the refraction angle is smaller than the incident angle. When the light enters the medium, in which the speed of light is high, from the medium, in which the speed of light is low, the refraction angle is greater than the incident angle. Therefore, it is possible to configure the second refractive index of the filling part 23 to be greater than the third refractive index of the base layer 25, and then to configure the third refractive index of the base layer 25 to be greater than the first refractive index of the optical structure 21, so that the output light of the display panel 10 is refracted to the optical structure 21 at the smaller refraction angle, and then refracted out of the optical film 20 at the larger first refraction angle, thereby implementing the requirement of the wide viewing angle of the optical film 20. Exemplarily, the materials of the optical structures 21, the filling part 23 and the base layer 25 may be resin materials having three different refractive indexes. For example, the refractive index of the resin material may range from 1.4 to 1.7, so the first refractive index of the optical structure 21, the second refractive index of the filling part 23 and the third refractive index of the base layer 25 may be respectively equal to 1.4, 1.6 and 1.7, and that the optical film 20 can satisfy the requirement of the wide viewing angle and further satisfy the requirement of the low reflectivity.

It is to be described that the adjustment of the output light can be implemented by adjusting the inner angle between the bottom wall 212 of the optical structure 21 and the sidewall 214 of the optical structure 21 provided with the arced surfaces 2142, adjusting the height of the optical structure 21, and selecting the materials of the base layer 25, the filling part 23 and the optical structures 21 to have different refractive indexes. Thus, the optical structure 21 can be used to diverge the incident light with the small viewing angle to the output light with the large viewing angle and thus to improve the viewing angle or achieve the objective of the wide viewing angle. In addition, the TIR of the arced surface 2142 can be implemented by adjusting the arc curvatures of the structures of the arced surfaces 2142 in conjunction with selecting of the refractive indexes of the base layer 25, the filling part 23 and the optical structures 21, thereby decreasing the surface light reflectivity of the display device 1.

Exemplarily, the inner angle between the sidewall 214 and the bottom wall 212 may range from 50° to 80°, and the height of the optical structure 21 may range from 10 microns to 30 microns. For example, parts of the optical film 20 of the embodiment of this disclosure may have the following configuration parameters. The inner angle between the sidewall 214 and the bottom wall 212 is equal to 60°. The height of the optical structure 21 may be equal to 20 microns. The first refractive index of the optical structure 21, the second refractive index of the filling part 23 and the third refractive index of the base layer 25 may be respectively equal to 1.4, 1.6 and 1.7. The radius of curvature of the structure of the arced surface 2142 may be equal to 2.5 microns. The above-mentioned parameter configurations of the parts of the optical film 20 can satisfy the requirements of the low reflectivity and the wide viewing angle of the optical film 20. Of course, the parameter configurations of the parts of the optical film 20 are not restricted to the above-mentioned conditions, and detailed examples thereof will be omitted herein.

It is to be described that the configurations of the optical film 20 of the embodiment of this disclosure can increase the viewing angle of the display device 1 while decreasing the surface reflectivity of the display device 1. It is unnecessary to combine various functions of films, so that the process is simple and adapted to the mass production.

Figure 6:
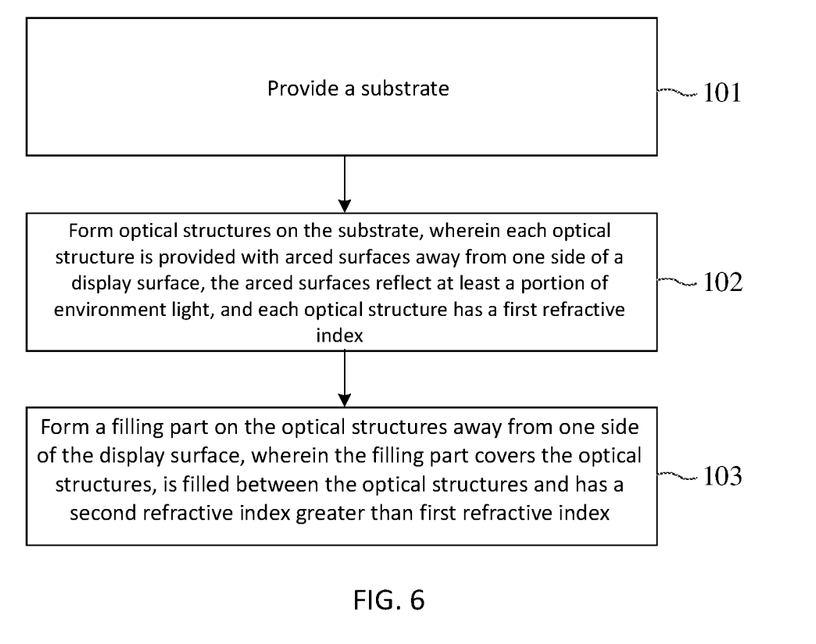
FIG. 6 is a schematic flow chart showing a preparation method of an optical film provided by an embodiment of this disclosure.

Exemplarily, please refer to FIG. 6. FIG. 6 is a schematic flow chart showing a preparation method of an optical film provided by an embodiment of this disclosure. The embodiment of this disclosure further provides a preparation method of an optical film. The structure and the principle of action of the optical film 20 may be found in the above-mentioned explanations corresponding to FIGS. 1 to 5, and detailed descriptions thereof will be omitted herein. The optical film 20 is applied to the display panel 10, and disposed on one side of the display surface of the display panel 10. The preparation method of the optical film includes steps 101 to 103.

In the step 101, a substrate is provided.

Exemplarily, before the optical structure 21 is manufactured, a smooth substrate on which multiple optical structures 21 are placed is needed. During production, the optical structures 21 may be directly formed on the substrate. After the optical structure 21 is formed, the substrate is etched off to obtain the optical structures 21. It is also possible to form a base layer 25 on the substrate in advance, and then to form the multiple optical structures 21. At last, the formed base layer 25 and the optical structures 21 are removed from the substrate.

In the step 102, multiple optical structures are formed on the substrate. One side of each optical structure away from the display surface is provided with multiple arced surfaces for reflecting at least a portion of environment light. Each optical structure has a first refractive index.

Exemplarily, a base material layer having multiple optical structures 21 arranged at equal intervals or adjacently arranged may be firstly formed on the substrate. For example, the base material layer may present a triangular prism shape, and the bottom wall of the base material layer contacts the substrate. Thereafter, a formation process is used to form the structures of the arced surfaces 2142 on the base material layer and thus to form the optical structures 21. The formation process may be a roll to roll process. Of course, the formation process may also be other thermoforming processes. For example, the optical structure 21 may also be formed in the package material by directly adopting the lithographing process (e.g., thin film encapsulation (TFE)), and may be directly used after being manufactured.

In the step 103, a filling part is formed on one side of the optical structures away from the display surface, wherein the filling part covers the optical structures, is filled between the optical structures, and has a second refractive index greater than the first refractive index.

After the optical structures 21 have been formed, a filling material may be injected onto the outsides of the optical structures 21 to form a smooth outer surface, and thus to form the structure of the filling part 23. The filling part 23 covers the optical structures 21 and is filled between the optical structures 21.

In some embodiments, when the base layer 25 is disposed on the substrate, the base layer 25, the optical structures 21 and the filling part 23 after being formed commonly constitute the optical film 20.

The optical film 20 of the embodiment of this disclosure may be disposed on the light emitting side of the display panel 10 and used. At least a portion of light outputted from the display panel 10 is incident to the optical structure 21 from the bottom wall 212 at a first incident angle, and is refracted out of the optical structure 21 through the arced surface 2142 at a first refraction angle. The first refraction angle is greater than the first incident angle. At least a portion of environment light is reflected to the non-display surface of the display panel 10 through the arced surfaces 2142. In the optical film 20 of the embodiment of this disclosure, adjusting the values of the refractive indexes of the filling part 23 and the optical structure 21 can adjust the critical angle of refraction between the optical structure 21 and the filling part 23, and thus implement the TIR of the optical structure 21. In addition, the arced surfaces 2142 capable of reflecting at least a portion of environment light are disposed in the optical structures 21, so that the curvatures of the arced surfaces 2142 can be adjusted to implement the adjustment of the angle of reflection to the environment light and to implement the adjustment of the angle of reflection to the environment light, and that the display device 1 can implement the requirement of the low reflectivity through the optical film 20. The first refraction angle of the output light of the display panel 10 can be as large as possible by adjusting the tilt angles, thereby satisfying the requirement of the wide viewing angle of the optical film 20. The optical film 20 of the embodiment of this disclosure can satisfy the requirement of the wide viewing angle as well as the requirement of the low reflectivity. It is only necessary to configure the optical structure 21 to have the prismatic shape, and to configure the arced surfaces 2142 on the optical structure 21, so that both the above-mentioned requirements can be satisfied. Compared with the conventional composite film, the process becomes simple.

In the above-mentioned embodiments, the description of each embodiment has its own focus. For parts that are not described in detail in one embodiment, reference can be made to the relevant description of other embodiments.

In the description of this disclosure, the terms "first" and "second" are only used for descriptive purposes, and cannot be understood as indicating or implying relative importance or implicitly indicating the number of technical features as indicated. Thus, the features restricted by "first" and "second" may expressly or implicitly include one or more features.

Detailed introductions have been made to the optical film and the display device provided by the embodiments of this disclosure. In this disclosure, specific examples are used to explain the principles and implementation of this disclosure. The descriptions of the above-mentioned embodiments are only used to help the understanding of the method and core idea of this disclosure. Meanwhile, those skilled in the art will make changes to the specific implementation and the application scope according to the idea of this disclosure. In summary, the contents of this specification should not be construed as a limitation to this disclosure.

What is claimed is:

1. An optical film applied to a display panel, wherein the optical film is disposed on one side of a display surface of the display panel, and the optical film comprises:
    multiple optical structures, wherein one side of each of the optical structures away from the display surface is provided with multiple arced surfaces for reflecting at least a portion of environment light, and each of the optical structures has a first refractive index;
    a filling part, which is disposed on one side of the optical structures away from the display surface, covers the optical structures, is filled between the optical structures, and has a second refractive index greater than the first refractive index; and
    a base layer disposed on one side of the optical structures facing the display panel;
    wherein each of the optical structures is in contact with the base layer;
    each of the optical structures comprises a bottom wall and multiple sidewalls, wherein the bottom wall is disposed on one side of the sidewall facing the display panel, and the sidewalls tilt to the bottom wall;
    the base layer has a third refractive index, which is greater than the first refractive index and smaller than the second refractive index.

2. The optical film according to claim 1, wherein the arced surfaces are disposed on at least one of the sidewalls.

3. The optical film according to claim 2, wherein at least a portion of light outputted from the display panel is incident to the optical structures from the bottom wall at a first incident angle, and is refracted out of the optical structures through the sidewall at a first refraction angle greater than the first incident angle; and at least a portion of environment light is reflected to a non-display surface of the display panel through the arced surfaces.

4. The optical film according to claim 2, wherein each of the arced surfaces is depressed toward the bottom wall or projects away from the bottom wall.

5. The optical film according to claim 2, wherein two of the sidewalls extending in a lengthwise direction of the optical structure are respectively provided with multiple ones of the arced surfaces, and inner angles respectively formed between two of the sidewalls and the bottom wall are equal to each other.

6. The optical film according to claim 5, wherein ends of two of the sidewalls away from the bottom wall are connected together.

7. The optical film according to claim 5, wherein each of the optical structures further comprises a top wall, which is disposed opposite the bottom wall and connected to two of the sidewalls.

8. A display device, comprising a display panel and an optical film, wherein the optical film is disposed on one side of a display surface of the display panel, and the optical film comprises:

multiple optical structures, wherein one side of each of the optical structures away from the display surface is provided with multiple arced surfaces for reflecting at least a portion of environment light, and each of the optical structures has a first refractive index;

a filling part, which is disposed on one side of the optical structures away from the display surface, covers the optical structures, is filled between the optical structures, and has a second refractive index greater than the first refractive index; and a base layer disposed on one side of the optical structures facing the display panel;

wherein each of the optical structures is in contact with the base layer;

each of the optical structures comprises a bottom wall and multiple sidewalls, wherein the bottom wall is disposed on one side of the sidewall facing the display panel, and the sidewalls tilt to the bottom wall;

the base layer has a third refractive index, which is greater than the first refractive index and smaller than the second refractive index.

9. The display device according to claim 8, wherein the arced surfaces are disposed on at least one of the sidewalls.

10. The display device according to claim 9, wherein at least a portion of light outputted from the display panel is incident to the optical structures from the bottom wall at a first incident angle, and is refracted out of the optical structures through the sidewall at a first refraction angle greater than the first incident angle; and at least a portion of environment light is reflected to a non-display surface of the display panel through the arced surfaces.

11. The display device according to claim 9, wherein each of the arced surfaces is depressed toward the bottom wall or projects away from the bottom wall.

12. The display device according to claim 9, wherein two of the sidewalls extending in a lengthwise direction of the optical structure are respectively provided with multiple ones of the arced surfaces, and inner angles respectively formed between two of the sidewalls and the bottom wall are equal to each other.

13. The display device according to claim 12, wherein ends of two of the sidewalls away from the bottom wall are connected together.

14. The display device according to claim 12, wherein each of the optical structures further comprises a top wall, which is disposed opposite the bottom wall and connected to two of the sidewalls.

\* \* \* \* \*